United States Patent
Chen et al.

(10) Patent No.: US 8,044,688 B2
(45) Date of Patent: Oct. 25, 2011

(54) SYSTEMS AND METHODS FOR DETERMINING AN OUT OF BAND SIGNAL

(75) Inventors: Mingdeng Chen, Cupertino, CA (US);
Ari Valero-Lopez, Macungie, PA (US);
Weiwei Mao, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 717 days.

(21) Appl. No.: 12/038,972

(22) Filed: Feb. 28, 2008

(65) Prior Publication Data

US 2009/0219057 A1    Sep. 3, 2009

(51) Int. Cl.
*G11C 27/02* (2006.01)
*H03K 5/00* (2006.01)
*H03K 7/00* (2006.01)
*H03K 19/00* (2006.01)
*H04L 7/00* (2006.01)

(52) U.S. Cl. ............. 327/91; 375/355; 327/141; 326/93

(58) Field of Classification Search .................. None
See application file for complete search history.

(56) References Cited

U.S. PATENT DOCUMENTS

| 2005/0220242 A1* | 10/2005 | Ogasawara | 375/376 |
|---|---|---|---|
| 2006/0197564 A1* | 9/2006 | Yen | 327/156 |
| 2006/0197692 A1* | 9/2006 | Gong et al. | 341/155 |
| 2007/0047690 A1* | 3/2007 | Zhao et al. | 375/376 |

OTHER PUBLICATIONS

Dipaolo et al., "Serial ATA Physical Link Initialization with the GTP Transceiver of Virtex-5 LXT FPGAs", Application Note: Virtex-5 FPGAs, Jan. 3, 2008, pp. 1-16.
Deyring ed., "Serial ATA: High Speed Serialized AT Attachment", Serial ATA Workgroup, Aug. 29, 2001, pp. 1-307.

* cited by examiner

*Primary Examiner* — Shawki S Ismail
*Assistant Examiner* — Dylan White
(74) *Attorney, Agent, or Firm* — Hamilton DeSanctis & Cha

(57) ABSTRACT

Various embodiments of the present invention provide systems and circuits that provide for out of band detection. As one example, an out of band detection circuit is disclosed that includes an input signal, a clock generation circuit, and a sampling circuit. The clock generation circuit receives the input signal and derives therefrom a sampling clock, and the sampling circuit is operable to sample the input signal at a time indicated by the sampling clock.

24 Claims, 5 Drawing Sheets

SYSTEMS AND METHODS FOR DETERMINING AN OUT OF BAND SIGNAL

BACKGROUND OF THE INVENTION

The present invention is related to systems and methods for determining the validity of a signal, and more particularly to systems and methods for determining an out of band condition of an input signal.

Currently, various systems utilize serial links that define out of band signaling. For example, a serial ATA link is a high speed link that may be used in relation to various storage devices such as hard disk drives. Out of band signals are incorporated within the signaling scheme and are used to complete initialization and to negotiate link speed. In a typical system, the out of band signals are data bursts unrelated to the data being transferred (hence the name out of band) that are interspersed with idles exhibiting a voltage below a particular known level. The time durations of the out of band bursts are typically fixed, but the duration of the intervening idles may vary. To use the out of band signaling, it is necessary to detect peak thresholds of a received data signal. Thus, systems relying on out of band signaling generally incorporate a circuit including an amplifier and a peak detector capable of identifying out of band signals. In a typical implementation, an input signal includes a burst of out of band information with a frequency of 1.5 Gbps. Existing circuits designed to detect the aforementioned information include an amplifier and a peak detector. An amplifier operating at 1.5 Gbps consumes considerable power. Further, such an amplifier often requires customization when it is used in different designs. Yet further, a peak detector capable of operating at 1.5 Gbps is not easily implemented.

Turning to FIG. 1, a prior art out of band detection circuit 100 is depicted. Out of band detection circuit 100 includes a capacitor 110 that AC couples an input signal 105 to a summing node 115. Detection/Hysteresis 120 is subtracted from input signal 105 at summing node 115. The difference between input signal 105 and Detection/Hysteresis 120 is amplified by an amplifier 125. In typical implementations, amplifier 125 is a multi-stage amplifier. The output of amplifier 125 drives a peak detector circuit 130 that is operable to identify a peak value of the amplified sum of input signal 105 and Detection/Hysteresis 120. The detected peak value is provided to a comparator 135 where it is compared against a reference signal 140. Reference signal 140 may be developed by replicating circuitry in peak detector 130 that allows it to track operation over a wide variety of temperature and process. Where the output of peak detector 130 exceeds that of reference signal 140, an out of band signal 145 is asserted.

Hence, for at least the aforementioned reasons, there exists a need in the art for advanced systems and methods for determining an out of band signal.

BRIEF SUMMARY OF THE INVENTION

The present invention is related to systems and methods for determining the validity of a signal, and more particularly to systems and methods for determining an out of band condition of an input signal.

Various embodiments of the present invention provide out of band detection circuits. Such circuits include an input signal, a clock generation circuit, and a sampling circuit. The clock generation circuit receives the input signal and derives therefrom a sampling clock, and the sampling circuit is operable to sample the input signal at a time indicated by the sampling clock. In some instances of the aforementioned embodiments of the present invention, the input signal is a serial data signal received from a serial interface. Further, in one or more instances of the aforementioned embodiments of the present invention, the input signal is AC coupled to the clock generation circuit using a capacitor.

In various instances of the aforementioned embodiments of the present invention, the clock generation circuit buffers the input signal to both delay the input signal and to generate a rail to rail recovered clock. The recovered clock causes a resettable flip flop to set, and a delayed version of an output of the resettable flip flop is used to reset the resettable flip flop. In some cases, the output of the resettable flip flop is the sampling clock.

In some instances of the aforementioned embodiments of the present invention, the sampling circuit includes a switch that is controlled by the sampling clock. In such cases, the switch connects the input signal to a sampling capacitor, and a value maintained on the sampling capacitor is compared with a reference by a comparator. The output of the comparator indicates an out of band signal when the value maintained on the sampling capacitor exceeds the reference. In various instances, the value maintained on the sampling capacitor is electrically coupled to the comparator via a filter.

Other embodiments of the present invention provide methods for identifying an out of band condition. Such methods include receiving an input signal, generating a clock based on the input signal, and sampling the input signal using the clock to create an input sample. The input sample is compared with a reference, and an out of band signal is asserted based at least in part on a result of the comparison of the input sample with the reference. In some instances of the aforementioned embodiments of the present invention, the input signal is a serial data signal received from a serial interface. In various instances of the aforementioned embodiments of the present invention, generating the clock includes delaying the input signal, clocking a resettable flip flop using the delayed input signal such that the resettable flip flop is set, and resetting the resettable flip flop using an output of the resettable flip flop.

In some instances of the aforementioned embodiments of the present invention, sampling the input signal includes closing a switch based on an assertion of the clock. Closing the switch electrically couples the input signal to a sampling capacitor. In various cases, comparing the input sample with the reference includes applying a filtered version of the input signal to one input of a comparator, and applying the reference to the other input of the comparator.

Yet other embodiments of the present invention provide systems for processing information. Such systems include a transferring device that provides an input signal via a serial interface, and a receiving device that receives the input signal via the serial interface. Further, the receiving device includes an out of band detector with a clock generation circuit and a sampling circuit. In some instances of the aforementioned embodiments of the present invention, the clock generation circuit receives the input signal and derives therefrom a sampling clock, and the sampling circuit is operable to sample the input signal at a time indicated by the sampling clock. In some cases, the clock generation circuit buffers the input signal to both delay the input signal and to generate a rail to rail recovered clock. The recovered clock causes a resettable flip flop to set, and an output of the resettable flip flop is used to reset the resettable flip flop and is used as the sampling clock. In one particular instance of the aforementioned embodiments of the present invention, the receiving device is a hard disk drive device.

In some instances of the aforementioned embodiments of the present invention, the sampling circuit includes a switch that is controlled by the sampling clock. The switch connects the input signal to a sampling capacitor, and a value maintained on the sampling capacitor is compared with a reference by a comparator. In some cases, an output of the comparator indicates an out of band signal when the value maintained on the sampling capacitor exceeds the reference.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for determining the validity of a signal, and more particularly to systems and methods for determining an out of band condition of an input signal.

Various embodiments of the present invention generate a clock from an incoming input data set, and use this clock to sample the input data itself. In this way, the detection/hysteresis information of the prior art may be compared directly with the sampled input data to determine any out of band signal. As such, the amplifier and peak detector used in the prior art approach may be eliminated. This results in a savings of power and a reduction in circuit complexity. Further, compensation for any offset in either the peak detector or the amplifier may be eliminated. Yet further, the need for a reference signal that is capable of tracking over temperature and process is eliminated. In sum, various embodiments of the present invention provide for out of band detection that requires reduced power and circuit complexity.

Figure 2:
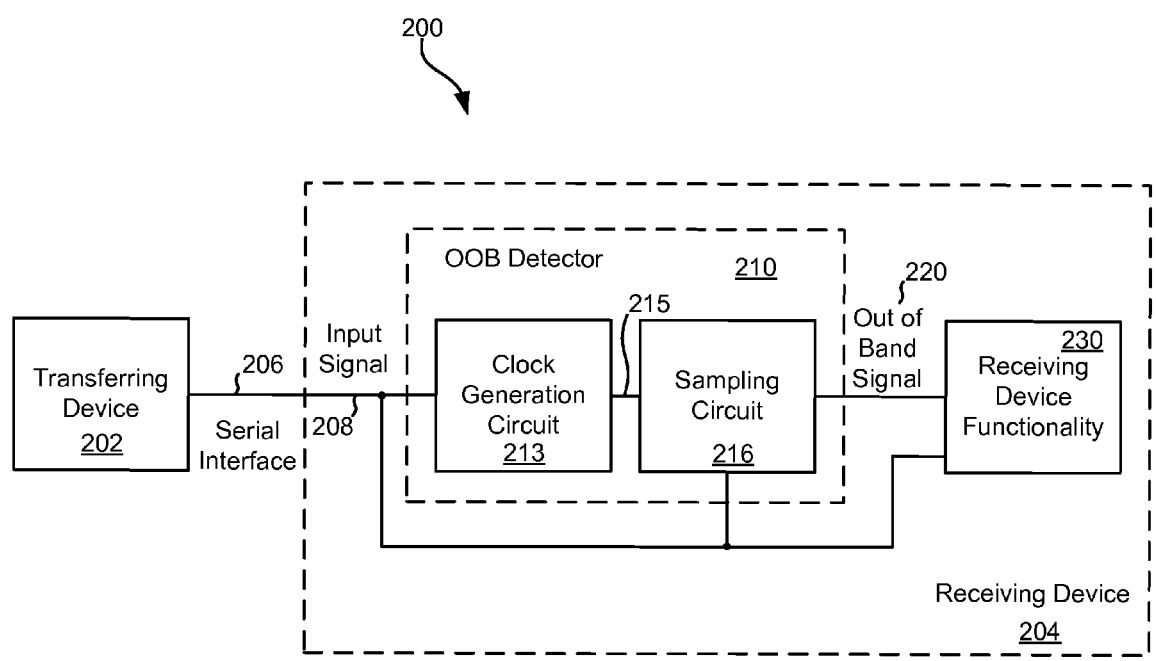
FIG. 2 is a serial link based system using an out of band detector in accordance with one or more embodiments of the present invention.

Turning to FIG. 2, serial link based system 200 using an out of band detector 210 is depicted in accordance with one or more embodiments of the present invention. Serial link based system 200 includes a transferring device 202 and a receiving device 204 that are communicably coupled by a serial interface 206. Serial interface 206 may be any type of serial interface employing out of band signaling. In one particular embodiment of the present invention, serial interface 206 is a serial ATA interface. Based on the disclosure provided herein, one of ordinary skill in the art will recognize other serial interfaces to which embodiments of the present invention may be applied.

It should be noted that in some embodiments of the present invention that one or both of transferring device 202 and receiving device 204 may include both transmission and reception ability, however, for the purposes of the discussion provided herein, only a one way transfer of information is discussed. It should be noted that serial link based system 200 may be any number of systems known in the art where information is transferred from a transferring device to a receiving device (recognizing that both of the transferring device and the receiving device may be capable of receiving and transmitting information). As just one of many examples, serial link based system 200 may be a personal computer where the transferring device and the receiving device are the general function of the computer and a hard disk drive. In such a case, both the hard disk drive and the general function of the computer both have the ability to transfer and receive information via the serial interface. In such a case, each may at times operate at the transferring device and at other times may operate as the receiving device. Based on the disclosure provided herein, one of ordinary skill in the art may recognize other systems communicably coupled devices that may be used in accordance with different embodiments of the present invention.

In this case, transferring device 202 provides an input signal 208 to receiving device 204. Input signal 208 is provided to out of band detector 210 and to a block 230 implementing the functionality of the receiving device 204. Out of band detection circuit 210 includes a clock generation circuit 213 and a sampling circuit 216. Clock generation circuit 213 receives input signal 208 and generates a clock 215 at a frequency corresponding to input signal 208, but with a greatly reduced duty cycle. The duty cycle is less than one half of the period of input signal 208. Clock 215 is provided to sampling circuit 216 where it is used to sample input signal 208 and generate an out of band signal 220 based on a comparison of a sample of input signal 208 with a reference (not shown). Out of band signal 220 is provided to block 230 where it is utilized to govern communications ongoing over serial interface 206 in accordance with a signaling protocol applicable to serial interface 206.

Figure 3:
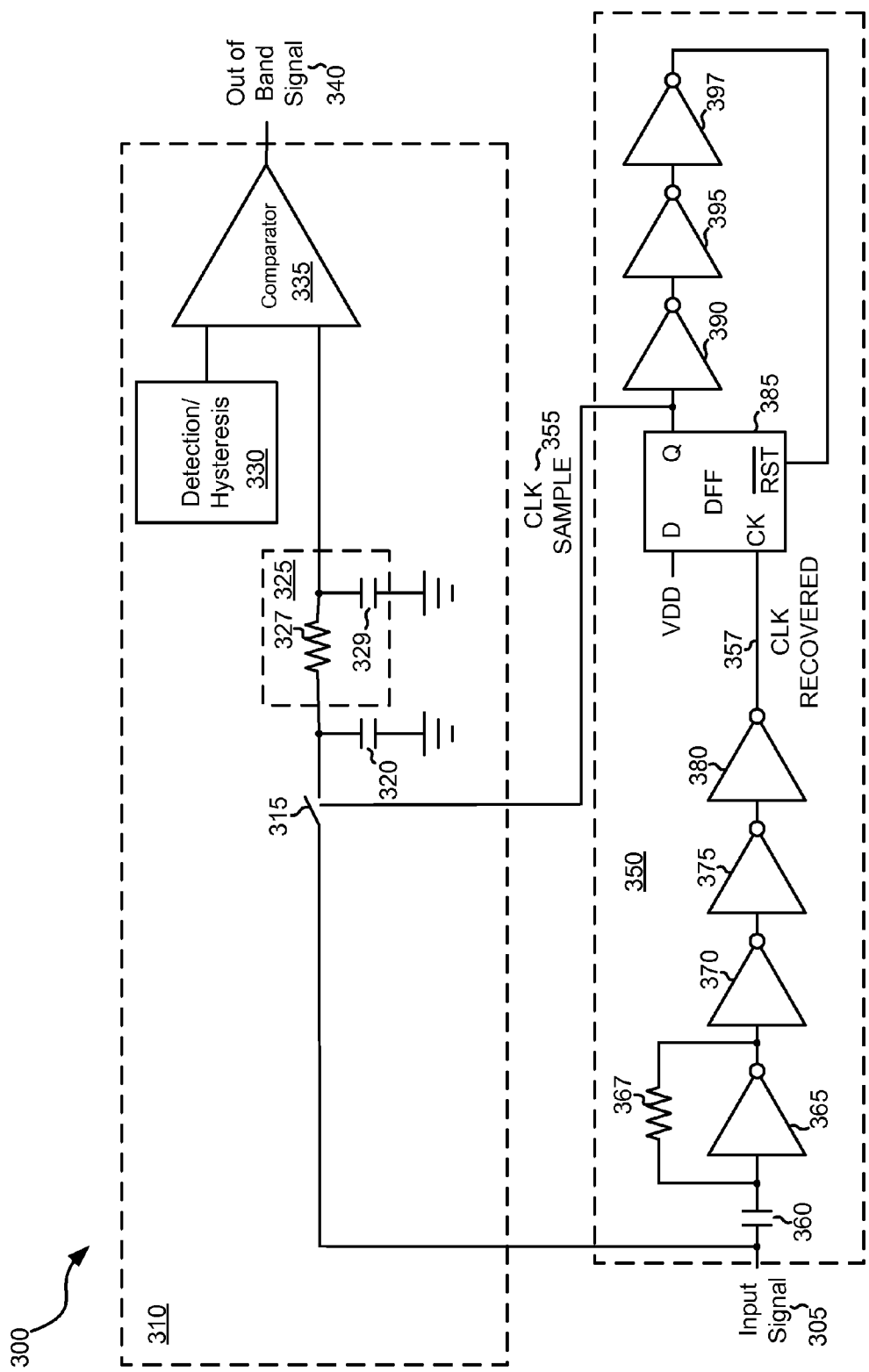
FIG. 3 depicts an out of band detection circuit in accordance with various embodiments of the present invention.

Turning to FIG. 3, an out of band detection circuit 300 is depicted in accordance with various embodiments of the present invention. Out of band detection circuit 300 may be used in place of out of band detection circuit 210 of FIG. 2. Out of band detection circuit 300 includes a sampling circuit 310 and a clock generation circuit 350. A clock sample output 355 from clock generation circuit 350 is derived form an input signal 305, and is used to control a sample period of input signal 305. Thus, a sampling clock used to sample input signal 305 is derived from input signal 305 itself.

Clock generation circuit 350 includes a capacitor 360 that AC couples input signal 305 to a chain of inverters including an inverter 365, an inverter 370, an inverter 375 and an inverter 380. The output of the inverter chain is a clock recovered signal 357 that is used to clock a resettable flip-flop 385. Inverters 365, 370, 375, 380 operate in part as delay elements and may be replaced with buffers or other types of delay elements as are known in the art. As will be more fully described below in relation to FIG. 3, the number of inverters or other delay elements that are used is not terribly critical and is limited by the period of input signal 305. In this case, the output of inverter 365 is connected to the input of inverter 365 via a resistor 367. Resistor 367 is used to set the DC level of the incoming signal at the threshold of inverter 370. The output of inverter 370 may not be rail to rail, but the output of inverter 380 is rail to rail. This causes a relatively small input signal 305 to operate rail to rail. Thus, the output of inverter 380 is a rail to rail signal representing input signal 305.

A rising edge of clock recovered signal 357 causes the output of resettable flip-flop 385 (i.e., clock sample output 355) to be asserted high as the data input of resettable flip-flop 385 is connected to VDD (i.e., the upper voltage rail). Clock sample output 355 drives a chain of inverters, with the output of the chain of inverters driving a reset input of resettable flip-flop 385. Thus, resettable flip-flop 385 resets itself shortly after it is set by clock recovered signal 357. The chain of inverters includes an inverter 390, an inverter 395 and an inverter 397. Inverters 390, 395, 397 operate as delay elements and may be replaced with buffers or other types of delay elements as are known in the art. As will be more fully described below in relation to FIG. 3, the number of inverters or other delay elements that are used is not terribly critical and is limited by the period of input signal 305.

Figure 1:
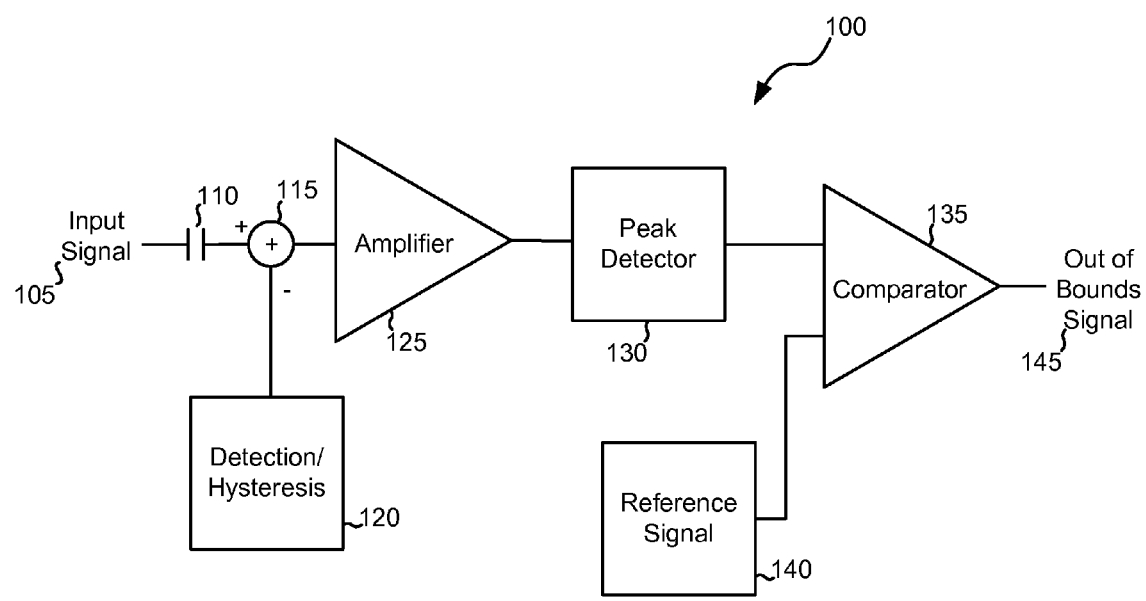
FIG. 1 depicts a prior art out of band detection circuit.

Sampling circuit 310 includes a sampling switch 315 that is closed whenever clock sample output 355 is asserted high, and opened whenever clock sample output 355 is asserted low. Sampling switch 315 electrically couples input signal 305 to a sampling capacitor 320 when it is closed. An RC filter 325 including a resistor 327 and a capacitor 329 filters any noise from input signal 305. The output of RC filter 325 is provided to a comparator 335. The other input of comparator 335 is the output of a Detection/Hysteresis circuit 330. Detection/Hysteresis circuit 330 provides a detection level (i.e., a reference) against which the sample of the input signal is compared. Once the comparator detects an out of band condition, the hysteresis part of the circuit reduces the detection level to assure that the sampled input signal is consistently larger than the original detection level to avoid glitches at the comparator output if the sampled input is very close to the detection level. In some embodiments of the present invention, Detection/Hysteresis circuit 330 provides the same output that was available and utilized in prior art out of band detection circuit such as that described above in relation to FIG. 1. Comparator 335 compares the aforementioned inputs and provides an out of band signal 340. Out of band signal 340 is asserted high whenever the sample of input signal exceeds the value provided by Detection/Hysteresis circuit 330, and is asserted low at other times. Based on the disclosure provided herein, one of ordinary skill in the art will recognize that alternative assertion levels may be chosen depending upon particular design constraints or decisions.

It should be noted that while out of band detection circuit 300 is depicted as a single ended circuit, that it may be implemented as a differential circuit. In such a case, input signal 305 is a differential input signal and other elements of the circuit are modified to handle the differential operation.

Figure 4:
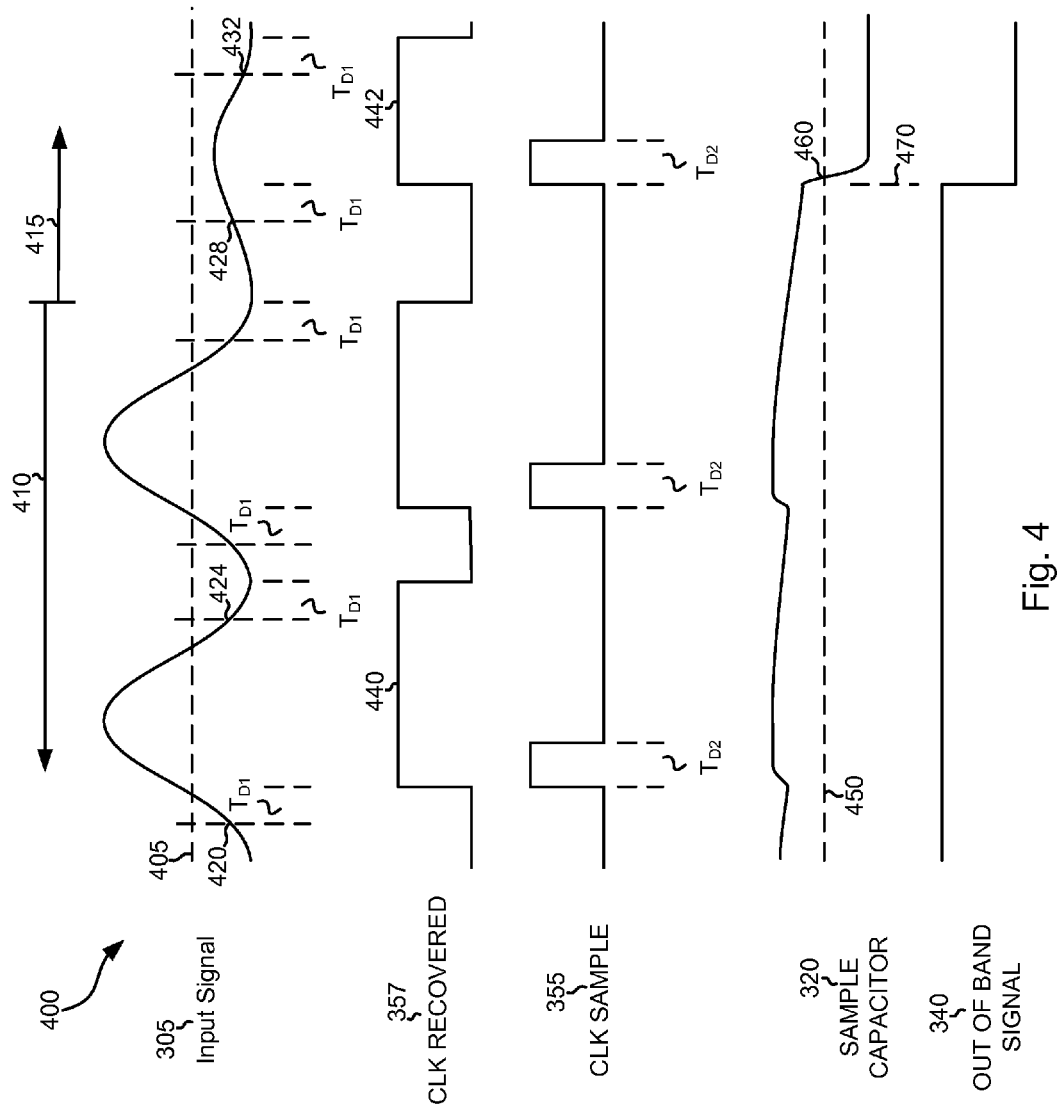
FIG. 4 is a timing diagram showing an exemplary operation of the out of band detection circuit of FIG. 3.

Turning to FIG. 4, a timing diagram 400 shows an exemplary operation of the out of band detection circuit of FIG. 3 discussed above. As shown, input signal 305 is a time varying AC signal. Input signal 305 has an amplitude indicating an out of band signal during some periods 410, and another amplitude indicating an idle signal during other periods 415. Out of band signals exceed a threshold 405 (noted by a dashed line), while other signals are lower than threshold 405. While input signal 305 is shown as having a consistent period and approximately a fifty percent duty cycle, it should be noted that in some cases the period and duty cycle may vary in some particular cases. As shown, once input signal 305 exceeds a switching threshold 420 associated with inverter 365, clock recovered signal 357 is asserted high a delay period (TD1) later. Clock recovered signal 357 remains asserted high until the same delay period passes after input signal traverses a switching threshold 424. TD1 is governed by the amount of delay introduced by the series of inverters 365, 370, 375, 380.

Clock recovered signal 357 clocks resettable flip flop 385 causing clock sample output 355 to assert high. Clock sample output 35 remains asserted high for a delay period (TD2) that corresponds to the number of inverters 390, 395, 397 chained together to drive the reset input of resettable flip flop 385. Clock sample output 355 needs to be asserted long enough to charge sampling capacitor 320, but not so long as to fail to sample the portion of input signal 305 that exceeds threshold 405. The combination of TD1 and TD2 governs the point at which input signal is sampled and the duration of the sample window. Based on the disclosure provided herein, one of ordinary skill in the art will recognize that TD1 and TD2 may assume a wide range of values depending upon, for example, the frequency of input signal 305 and threshold 405. In many instances, a number of different delay periods may be chosen for TD1 and TD2 which will provide adequate detection of an out of band signal. It should be noted that because of the amplitude difference of input signal 305 during out of band signaling 410 and idle signaling 415, that the high asserted period of clock recovered signal 357 may vary. Such is demonstrated by high asserted portion 440 in comparison with high asserted portion 442.

As shown, sampling capacitor 320 may experience some level of parasitic discharge when clock sample output 355 is asserted low, but is recharged whenever clock sample output 355 is again asserted high. This is sufficient to maintain the voltage on sampling capacitor 320 above a threshold 450 (indicated as a dashed line). Threshold 450 corresponds to the value provided by Detection/Hysteresis circuit 330. At the point where the value on sampling capacitor 320 transitions below threshold 450, out of band signal 340 transitions from high to low. This corresponds to closing sampling switch 315 (i.e., asserting clock sample output 355 high) when input signal 305 is below threshold 405 resulting in a discharge of sampling capacitor 320. Out of band signal 340 will remain asserted low until input signal 305 is again sampled when it is in excess of threshold 405 (i.e., upon the next out of band signaling period).

Figure 5:
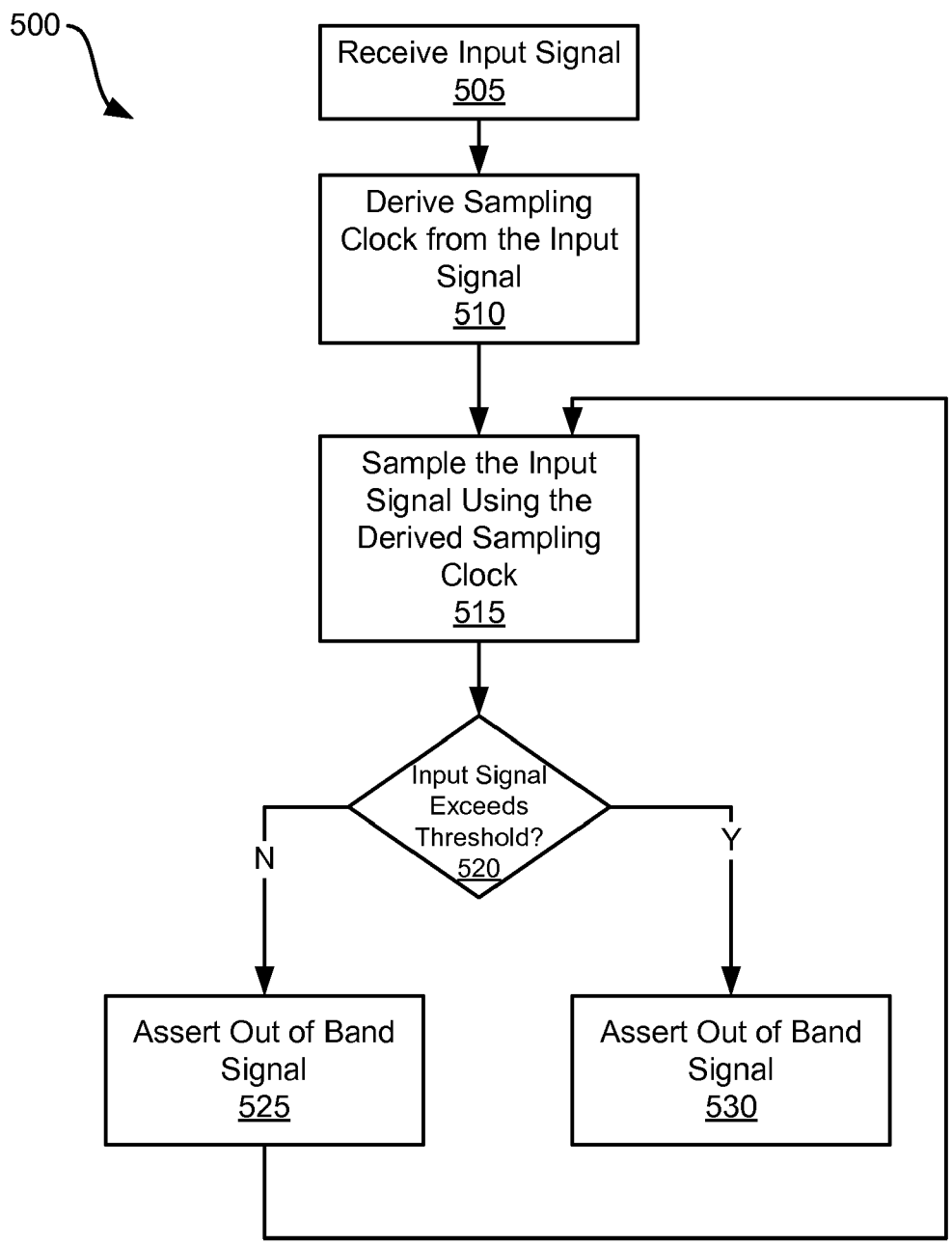
FIG. 5 is a flow diagram depicting a method for detecting an out of band condition in accordance with some embodiments of the present invention.

Turning to FIG. 5, a flow diagram 500 depicts a method in accordance with various embodiments of the present invention for detecting an out of band signal. Following flow diagram 500, an input signal is received (block 505), and a sampling clock is derived from the input signal (block 510). The input that is used to derive the sampling clock is then used to sample the same input signal (block 515). It is then determined whether the sample of the input signal exceeds a threshold corresponding to out of band signaling (block 520). Where the threshold is not exceeded (block 520), the out of band signal is de-asserted (block 525). Alternatively, where the threshold is exceeded (block 520), the out of band signal is asserted (block 530). This process is repeated with the repetitive sampling of the input signal and the assertion/de-assertion of the out of band signal to match the particular sampling value.

In conclusion, the invention provides novel systems, circuits, methods and arrangements for detecting an out of band signal. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An out of band detection circuit, the circuit comprising:
a clock generation circuit coupled to an input using a capacitor, wherein the clock generation circuit is operable to receive an input signal via the input and to derive a sampling clock from the input signal, and wherein the clock generation circuit buffers the input signal to both delay the input signal and to generate a rail to rail recovered clock; and
a sampling circuit, wherein the sampling circuit is operable to sample the input signal at a time indicated by the sampling clock.

2. The circuit of claim 1, wherein the input signal is a serial data signal received from a serial interface.

3. The circuit of claim 1, wherein the recovered clock causes a resettable flip flop to set, and wherein an output of the resettable flip flop is used to reset the resettable flip flop.

4. The circuit of claim 3, wherein the output of the resettable flip flop is the sampling clock.

5. The circuit of claim 1, wherein the sampling circuit includes a switch that is controlled by the sampling clock.

6. The circuit of claim 5, wherein the switch connects the input signal to a sampling capacitor, and wherein a value maintained on the sampling capacitor is compared with a reference by a comparator.

7. The circuit of claim 6, wherein an output of the comparator indicates an out of band signal when the value maintained on the sampling capacitor exceeds the reference.

8. The circuit of claim 6, wherein the value maintained on the sampling capacitor is electrically coupled to the comparator via a filter.

9. A method for identifying an out of band condition, the method comprising:
receiving an input signal;
delaying the input signal;
clocking a resettable flip flop using the delayed input signal, wherein the resettable flip flop is set;
resetting the resettable flip flop using an output of the resettable flip flop, wherein setting an resetting the resettable flip flop yields a clock;
sampling the input signal using the clock to create an input sample;
comparing the input sample with a reference; and
asserting an out of band signal based at least in part on a result of the comparison of the input sample with the reference.

10. The method of claim 9, wherein the input signal is a serial data signal received from a serial interface.

11. The method of claim 9, wherein sampling the input signal includes closing a switch based on an assertion of the clock, and wherein closing the switch electrically couples the input signal to a sampling capacitor.

12. The method of claim 11, wherein comparing the input sample with the reference includes applying a filtered version of the input signal to one input of a comparator, and applying the reference to the other input of the comparator.

13. A system for processing information, the system comprising:
a transferring device, wherein the transferring device provides an input signal via a serial interface; and
a receiving device, wherein the receiving device receives the input signal via the serial interface, wherein the receiving device includes an out of band detector with a clock generation circuit and a sampling circuit, and wherein the sampling circuit includes a switch operable to connect the input signal to a sampling capacitor.

14. The system of claim 13, wherein the clock generation circuit receives the input signal and derives a sampling clock from the input signal, and wherein the sampling circuit is operable to sample the input signal at a time indicated by the sampling clock.

15. The system of claim 14, wherein the clock generation circuit buffers the input signal to both delay the input signal and to generate a rail to rail recovered clock, and wherein the recovered clock causes a resettable flip flop to set, and wherein an output of the resettable flip flop is used to reset the resettable flip flop and is used as the sampling clock.

16. The system of claim 14, wherein an output of the comparator indicates an out of band signal when the value maintained on the sampling capacitor exceeds the reference.

17. The system of claim 13, wherein the receiving device is a hard disk drive device.

18. The system of claim 13, wherein a value maintained on the sampling capacitor is compared with a reference by a comparator.

19. An out of band detection circuit, the circuit comprising:
a clock generation circuit operable to receive an input signal and to derive a sampling clock from the input signal, wherein the clock generation circuit is operable to buffer the input signal to both delay the input signal and to generate a rail to rail recovered clock, wherein the recovered clock is operable to cause a resettable flip flop to set, and wherein an output of the resettable flip flop is operable to reset the resettable flip flop; and
a sampling circuit, wherein the sampling circuit is operable to sample the input signal at a time indicated by the sampling clock.

20. The circuit of claim 19, wherein the sampling circuit includes a switch that is controlled by the sampling clock.

21. An out of band detection circuit, the circuit comprising:
a clock generation circuit coupled to an input using a capacitor, wherein the clock generation circuit is operable to receive an input signal via the input and to derive a sampling clock from the input signal; and
a sampling circuit, wherein the sampling circuit is operable to sample the input signal at a time indicated by the sampling clock, and wherein the sampling circuit includes a switch that is controlled by the sampling clock.

22. The circuit of claim 21, wherein the switch connects the input signal to a sampling capacitor, and wherein a value maintained on the sampling capacitor is compared with a reference by a comparator.

23. The circuit of claim 22, wherein an output of the comparator indicates an out of band signal when the value maintained on the sampling capacitor exceeds the reference.

24. The circuit of claim 22, wherein the value maintained on the sampling capacitor is electrically coupled to the comparator via a filter.

* * * * *